(12) United States Patent
Werder et al.

(10) Patent No.: US 10,026,588 B2
(45) Date of Patent: Jul. 17, 2018

(54) IMAGING APPARATUS HAVING A PLURALITY OF MOVABLE BEAM COLUMNS, AND METHOD OF INSPECTING A PLURALITY OF REGIONS OF A SUBSTRATE INTENDED TO BE SUBSTANTIALLY IDENTICAL

(71) Applicant: Keysight Technologies, Inc., Minneapolis, MN (US)

(72) Inventors: Kurt Stephen Werder, Pleasanton, CA (US); Lawrence P. Muray, Moraga, CA (US); James P. Spallas, San Ramon, CA (US); William Daniel Meisburger, San Jose, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/755,389

(22) Filed: Jun. 30, 2015

(65) Prior Publication Data
US 2016/0064185 A1    Mar. 3, 2016

Related U.S. Application Data

(60) Provisional application No. 62/044,274, filed on Aug. 31, 2014.

(51) Int. Cl.
| | |
|---|---|
| *H01J 37/00* | (2006.01) |
| *H01J 37/29* | (2006.01) |
| *H01J 37/20* | (2006.01) |
| *H01J 37/22* | (2006.01) |
| *H01J 37/02* | (2006.01) |
| *H01L 21/66* | (2006.01) |

(52) U.S. Cl.
CPC .......... *H01J 37/292* (2013.01); *H01J 37/023* (2013.01); *H01J 37/20* (2013.01); *H01J 37/222* (2013.01); *H01L 22/00* (2013.01); *H01J 2237/0245* (2013.01); *H01J 2237/20228* (2013.01); *H01J 2237/2817* (2013.01)

(58) Field of Classification Search
CPC ........ H01J 37/292; H01J 37/222; H01J 37/20; H01J 37/063; H01J 2237/20228
USPC ................................ 250/306, 307, 310, 311
See application file for complete search history.

(56) References Cited

U.S. PATENT DOCUMENTS

| | | | |
|---|---|---|---|
| 5,430,292 A * | 7/1995 | Honjo ...................... | G03F 1/86 250/310 |
| 5,502,306 A | 3/1996 | Meisburger et al. | |
| 5,578,821 A | 11/1996 | Meisberger et al. | |

(Continued)

OTHER PUBLICATIONS

Hendricks, et al., "Characterization of a New Automated Electron-Beam Wafer Inspection System", Proc. SPIE vol. 2439, 1995.

(Continued)

*Primary Examiner* — Michael Maskell

(57) ABSTRACT

An apparatus for inspecting a substrate is described. The apparatus includes an X-Y stage that supports a substrate to be inspected and is operable to move a substrate supported thereby in X and Y directions; and an imaging system including a plurality of beam columns operable to irradiate regions of a substrate supported by the X-Y stage with beams of energy, respectively, discrete from one another. Respective ones of the beam columns are movable relative to others of the electron beam columns.

7 Claims, 7 Drawing Sheets

(56) References Cited

U.S. PATENT DOCUMENTS

| | | | |
|---|---|---|---|
| 6,509,750 | B1 | 1/2003 | Talbot et al. |
| 6,833,551 | B2 | 12/2004 | Avnery |
| 7,109,486 | B1 * | 9/2006 | Spallas .................. H01J 37/04 250/306 |
| 7,126,357 | B2 | 10/2006 | Kang |
| 7,746,088 | B2 * | 6/2010 | Abboud ............ H01L 21/67748 324/754.22 |
| 7,919,972 | B2 * | 4/2011 | Kurita ................ G01R 31/2893 324/750.16 |
| 7,935,926 | B2 * | 5/2011 | Kim ...................... G02F 1/1303 250/310 |
| 7,982,188 | B2 | 7/2011 | Shinada et al. |
| 2002/0015143 | A1 | 2/2002 | Yin et al. |
| 2013/0271595 | A1 * | 10/2013 | Hiroi ...................... G01B 15/00 348/80 |

OTHER PUBLICATIONS

Sandland, et al., "An electron-beam inspection system for x-ray mask production", J. Vac. Sci. Technol. B 9(6), 1991.

Brodie, et al., "Conceptual Models for Understanding and Minimizing Coulomb Interactions", Microelectronics Engineering, vol. 17, 1992.

Kim, et al., "Full MEMS monolithic microcolumn for wafer-level arrayal", J. Vac. Sci. Technol. B 22(6), 2004.

Baylor, et al., "Digital electrostatic electron-beam array lithography", J. Vac. Sci. Technol. B 20(6), 2002.

Silver, et al., "Multiple beam sub-80-nm lithography with miniature electron beam column arrays", J. Vac Sci Technol. B 25(6), Nov./Dec. 2007.

Spallas, et al., "Arrayed miniature electron beam columns for mask making", J. Vac Sci Technol. B 24(6), Nov./Dec. 2006.

Brodie, et al., The Physics of Micro/Nano-Fabrication, Plenum Press, p. 111, 1992.

Jansen, "Coulomb interactions in particle beams", J. Vac. Sci. Technol. B 6, 1988,.

Meisburger, et al., "Requirements and performance of an electron-beam column designed for x-ray mask inspection", J. Vac. Sci. Technol. B 9(6), 1991.

Meisburger, et al., "Low-voltage electron-optical system for the high-speed inspection of integrated circuits", J. Vac. Technol. B 10(6), 1992.

International Search Report & Written Opinion dated May 28, 2015 for International Application No. PCT/US2014/061807.

\* cited by examiner

IMAGING APPARATUS HAVING A PLURALITY OF MOVABLE BEAM COLUMNS, AND METHOD OF INSPECTING A PLURALITY OF REGIONS OF A SUBSTRATE INTENDED TO BE SUBSTANTIALLY IDENTICAL

CROSS-REFERENCE TO RELATED APPLICATIONS

The present application claims priority under 35 U.S.C. § 119(e) from commonly owned U.S. Provisional Application No. 62/044,274 filed on Aug. 31, 2014 to Werder, et al. The entire disclosure of U.S. Provisional Application No. 62/044,274 is specifically incorporated herein by reference.

BACKGROUND

In general, the manufacturing of semiconductor devices, lithography masks (photomasks or reticles) and the like includes the forming of identical patterns across a substrate. These patterns may constitute or correspond to integrated circuits or other micro-devices. For example, a semiconductor wafer may be processed to form identical integrated circuits at several regions of the wafer, and then the wafer is sliced to separate the regions from each other with each resulting piece being commonly referred to as a die. Also, each die may comprise a substrate (piece of the wafer), and a plurality identical patterns (e.g., memory cells of the integrated circuit) across the substrate.

The manufacturing of semiconductor devices and the like also includes a process of inspecting the patterns for various defects and for otherwise ensuring that the fabrication processes are producing substantially uniform patterns which lead to end products having specified or uniform operating characteristics.

Non-destructive apparatus for inspecting substrates to these ends have been available for some time. One such type of apparatus is an electronic beam inspection apparatus as disclosed in U.S. Pat. Nos. 5,502,306 and 5,578,821, the disclosures of which are hereby incorporated by reference in their entirety.

In the case of inspecting substrates for defects, usually images of two regions that were intended to be identical are captured and compared. These regions might be regions of two different die, or two regions within a memory. Differences between the two images greater than some threshold are potentially indicative of defects. If a defect is determined to exist, a third image is then compared with the original two to determine which of the original two images contains the potential defect. Subsequent processing can be used to determine features of the defect, such as size or color, that aid classification.

SUMMARY

One object is to provide an imaging system for imaging several regions and that has a high throughput.

Another object is to provide an imaging system for imaging several regions and that has a high throughput.

Another object is to provide substrate inspecting apparatus and a method of inspecting a substrate, which will not indicate false defects.

A more specific object is to provide a method of inspecting the dies of a wafer, which will not indicate false defects due to shot noise.

Still another object is to provide apparatus which enables the high speed detectability of low contrast defects.

Likewise, another object is to provide a method by which low contrast defects can be detected rapidly.

DETAILED DESCRIPTION

Figure 1:
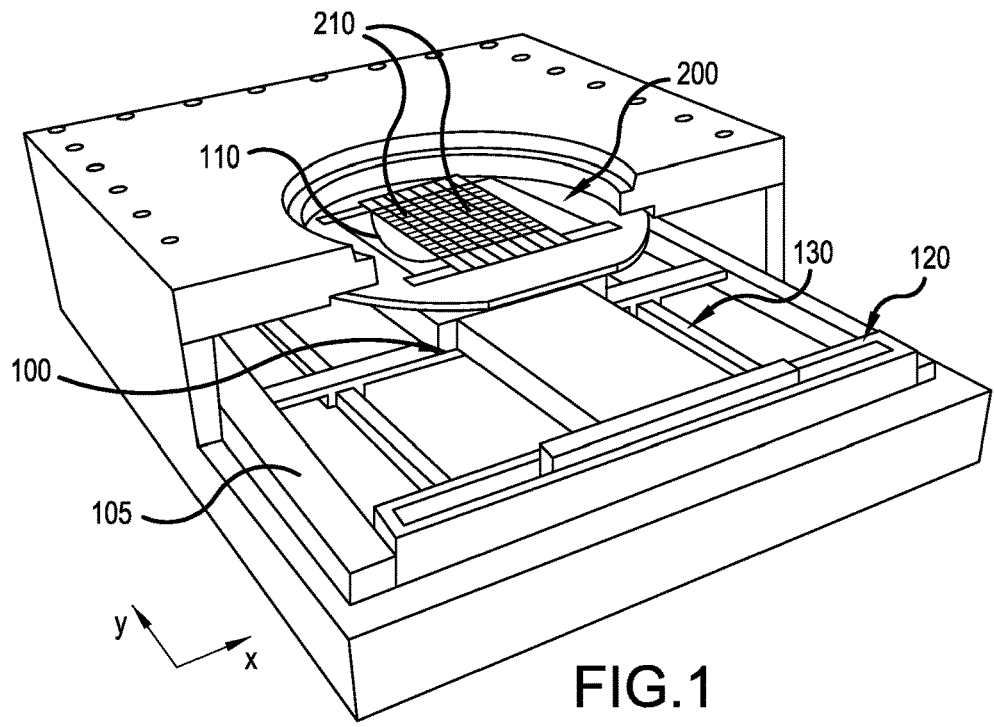
FIG. 1 is a perspective view of one embodiment of an imaging apparatus according to the inventive concept.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Also, the term beam of "energy" will refer to various types of beams used in the fields of imaging and inspection of semiconductors and the like and thus, will include beams of light as well as beams of charged particles.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one having ordinary skill in the art. For example, "approximately the same" means that one of ordinary skill in the art would consider the items being compared to be the same.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

One embodiment of an imaging apparatus according to the inventive concept will now be described in detail with reference to FIGS. 1-3.

Figure 2:
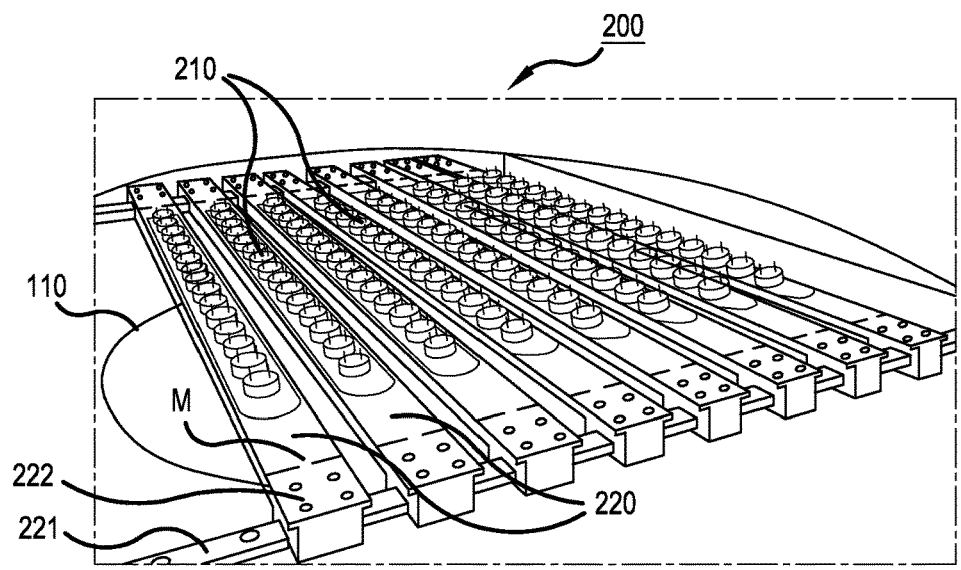
FIG. 2 is a enlarged view of an imaging system of the apparatus of FIG. 1.

Referring first to FIGS. 1 and 2, the apparatus includes an X-Y stage 100 that supports a substrate to be inspected and is operable to move a substrate in X and Y directions (x-axis and y-axis directions FIG. 1) independently of each other. The X-Y stage 100 includes a substrate support 110 configured to support the substrate, an X-driving mechanism 120 for moving the substrate support 110 in the X direction, and a Y-axis driving mechanism 130 for moving the substrate support 110 in the Y direction. In this embodiment, the Y-axis driving mechanism 130 includes Y-axis rails extending longitudinally in the Y direction and to which the substrate support 110 is mounted, and a motor for driving the substrate support 110 along the rails. The X-axis driving mechanism 120 includes X-axis rails extending longitudinally in the X direction and to which the Y-axis driving mechanism is mounted, and a motor for moving the Y-axis driving mechanism along the X-axis rails. The substrate support 110 is an electrostatic chuck. Other types of X-Y stages may be used instead. In any case, X-Y stages are known in the art per se and thus, the X-Y stage 100 will not be described in further detail.

The apparatus also includes an imaging system 200 supported above the X-Y stage 100. The imaging system 200 includes a plurality of beam columns 210 operable to irradiate regions of a substrate supported by the substrate support 110 of the X-Y stage 100 with discrete beams of energy, respectively.

Figure 3:
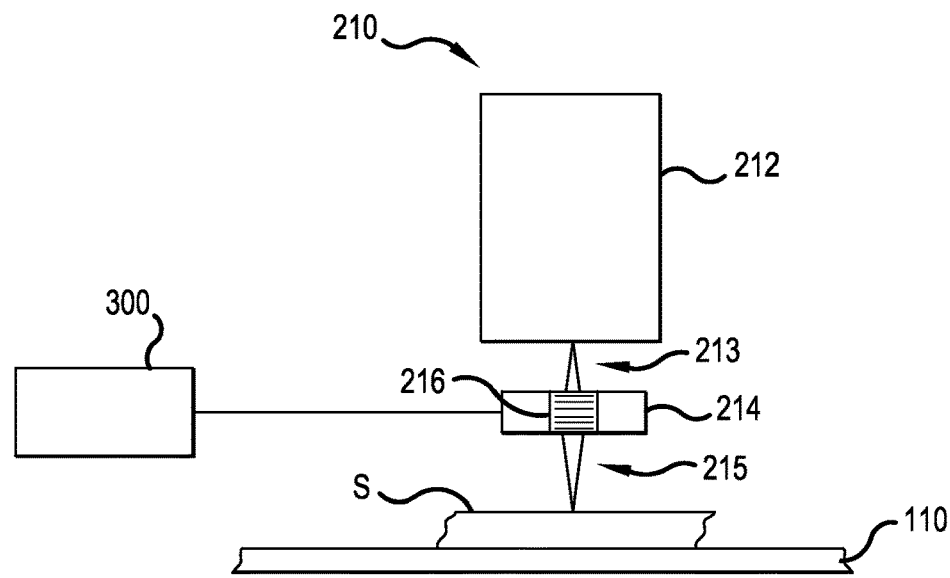
FIG. 3 is a schematic diagram of one of the beam columns of the imaging system.

Referring to FIG. 3, each beam column 210 may include an energy source 212 that emits energy 213, and an assembly 214 of components 216 that direct a beam 215 of the energy onto the substrate S supported by the substrate support 110 of the X-Y stage 100. The components 216 may include a lens(es) for focusing the energy 213 emitted by energy source 212, a deflector that scans the beam 215 across a region of the surface of the substrate S, and a detector that detects emissions from the substrate S as a result of it being irradiated by the beam 215, as will be described in more detail later. Furthermore, reference numeral 300 designates a processor of the imaging apparatus to which the detectors of the beam columns 210 are all connected so that the processor 300 can receive the outputs of all of the beam columns 210.

In this embodiment, the beam columns 210 may be e-beam "micro-columns" that irradiate the substrate S with discrete electron beams.

Examples of e-beam micro-columns that may be employed in this embodiment are disclosed in U.S. Pat. No. 7,109,486 issued on Sep. 19, 2006 to Novelx, Inc., and the disclosure of which is hereby incorporated by reference in its entirety. In the case in which such e-beam micro-columns are used as the beam columns 210, energy source 212 is a source of electrons 213, and assembly 214 includes discrete or integrated elements including a lens for focusing a beam 215 of electrons on the surface of the substrate S, a deflector for deflecting the beam 215 along the surface, and a detector for detecting electrons scattered from the surface of the substrate S.

Although an example has been given in which the beam columns 210 are e-beam columns for forming electron beams, other types of beam columns may be used instead. That is, the beam columns 210 may form beams of energy other than electron beams, including beams of light or beams of charged particles other than electrons.

Referring back to FIGS. 1 and 2, the imaging system 200 also includes a plurality of supports 220 by which respective ones of the beam columns 210 are movable relative to others of the beam columns 210.

In this embodiment, the supports 220 are independently movable relative to each other in at least one of the X and Y directions, and respective ones of the beam columns 210 are mounted to and spaced along each of the supports 220 so as to be movable therewith. More specifically, the supports 220 are a plurality of rails (and as such may be referred to below as rails 220), respectively, and the rails are supported on tracks 221 so as to be movable independently of one another in the X direction. Furthermore, X-axis drive mechanisms 222 are operative to drive the rails independently along the tracks 221. The X-axis drive mechanisms 222 may each comprise a stage at an end of the rail and running on a track, and a respective piezo-electric drive motor integrated with and connected between the stage and the track. Hence, the piezoelectric motors can move the supports 220 along the tracks 221 independently of one another to adjust to die pitch (described later on with respect to FIGS. 5-9) and correct for small angular errors. Furthermore, means such as flexure mounts M may also be provided on the ends of the supports 220 to allow the rails to be moved/adjusted longitudinally relative each other (i.e., in directions perpendicular to the tracks 221) to correct for small errors.

Figure 4:
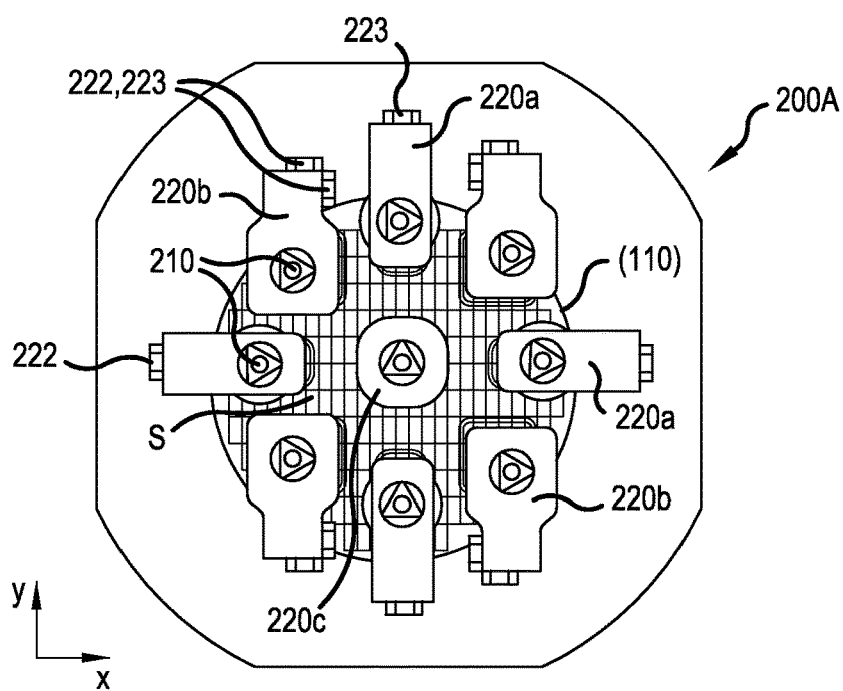
FIG. 4 is a plan view of an imaging system of another embodiment of an imaging apparatus according to the inventive concept.

The imaging system 200A of another embodiment of imaging apparatus according to the inventive concept is shown in FIG. 4. The imaging system also includes a plurality of movable supports 220a, 220b by which respective ones of the beam columns 210 are movable relative to others of the beam columns 220. For example, eight movable supports 220a, 220b are disposed along a circle corresponding to the outer periphery of the substrate support 210. In addition, a stationary support 220c is disposed at the center of the circle. Support 220c may also be on an x-y stage. In this embodiment, each of the movable supports 220a, 220b is independently movable relative to each other in both of the X and Y directions, but only one beam column 210 is mounted to each of the supports 220a, 220b so as to be movable therewith. In general, both axes of motion (x-y) for each column are needed.

Moreover, respective ones of the movable supports, namely those designated by 220a in the figure, may be supported so as to be movable in only one of the X and Y directions, whereas others of the movable supports, namely, movable supports 220b are supported so as to be independently movable in both the X and Y directions. Thus, in this figure, reference numeral 222 designates an X-axis driving mechanism (X-axis track and drive motor for driving the beam column support along the track), and reference numeral 223 designates a Y-axis driving mechanism (Y-axis track and drive motor for driving the beam column support along the track). In the case of movable supports 220*b*, therefore, the X-axis and Y-axis driving mechanisms 222, 223 are configured as an X-Y stage.

A method of imaging the dies of a wafer using apparatus according to the inventive concept will now be described with reference to FIGS. 5-9. The method will be described for purposes of illustration only with reference to an example of the embodiment of FIGS. 1 and 2 but a similar method can be carried out using the embodiment of FIG. 4.

Figure 5:
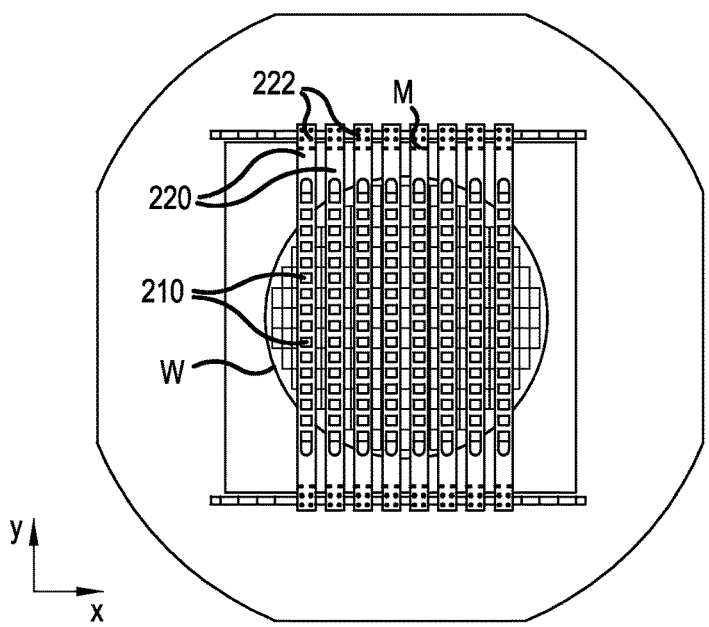
FIG. 5 is a schematic plan view of the imaging system of the apparatus of FIG. 1 in a pre-alignment position with respect to a wafer.

FIG. 5 shows an array of beam columns 210, e.g., e-beam micro-columns 210, disposed over a wafer W whose dies have a certain pitch in the X direction. In this example, there are eight supports 220, and sixteen respective beam columns 210 supported by each support 220 as spaced from one another (center-to-center) along the rail by 17 mm. Also, in this example, the pitch of the dies is 10.5 mm in the X direction and 22 mm in the Y direction. The wafer W is 300 mm diameter semiconductor wafer.

Figure 6:
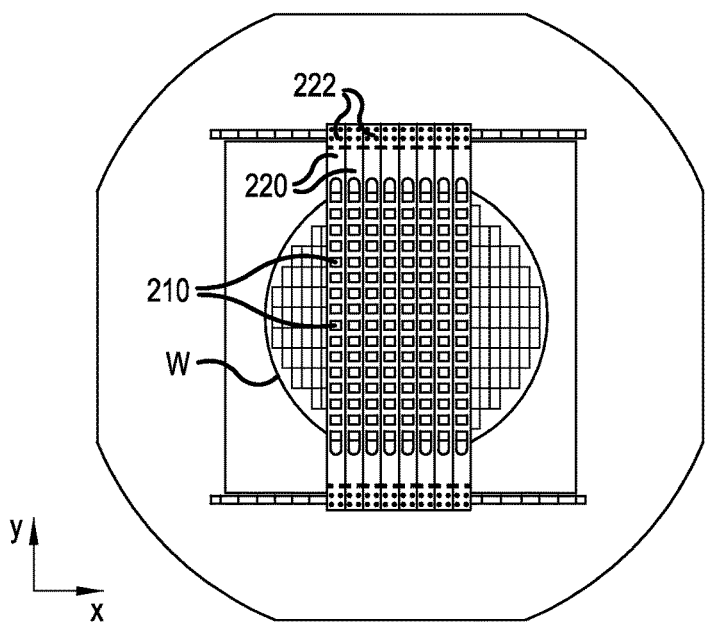
FIG. 6 is a schematic plan view, similar to FIG. 5, but showing the imaging system of the apparatus of FIG. 1 in an aligned position at which the wafer is about to be imaged.

FIG. 6 shows the movement of the supports 220 to positions at which the beam columns 210 have a pitch twice that of the dies of the wafer W in the X direction, i.e., the beam columns 210 have a pitch of 21 mm in this example. This may be referred to as the aligned position of the imaging system. To this end, course alignment may be effected by driving the supports 220 in the X direction with the X-axis driving mechanisms 222 (piezo-electric motors, for example) with the rails, and a fine adjustment may be effected by shifting the position of each beam 215 using a component(s) 216 of the beam column 210 (FIG. 3). Beam alignment is also used to correct for small mechanical placement errors of the beam columns 210 in each support 220.

Figure 7:
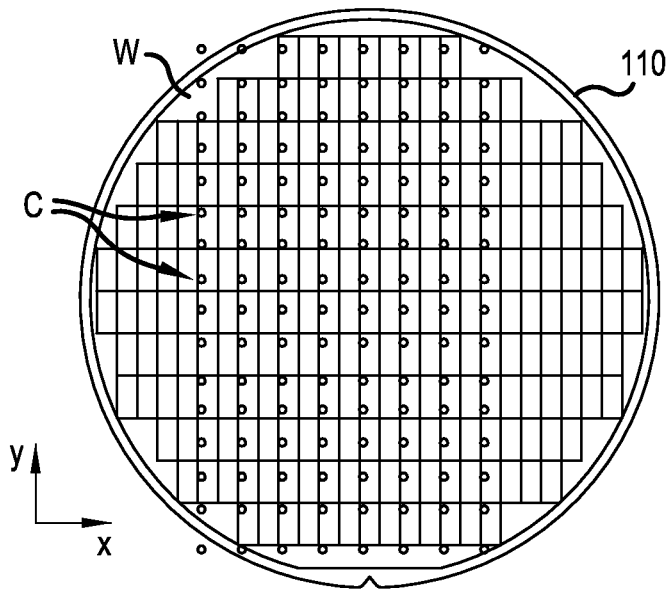
FIG. 7 is a schematic plan view of the wafer and substrate support when the imaging system in the aligned position.

FIG. 7 shows the (axial) centers C of the beam columns 210 when the imaging system is in the aligned position. Of course, the substrate support 110 may have to be moved to achieve this aligned position. The axial centers C are coincident with the spots on the wafer impinged by the beams when the imaging system is first brought to the aligned position. The axial centers C may be coincident with the optical axes of the energy source 212 and components 216 of the beam column of FIG. 3.

Figure 8:
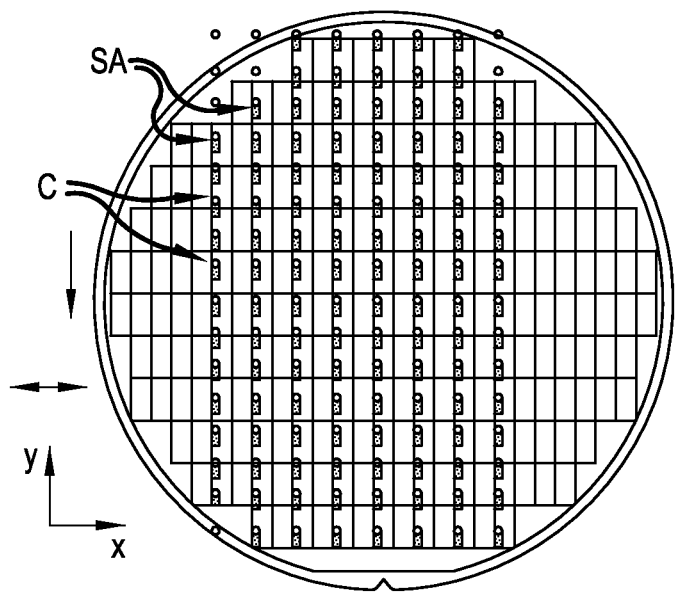
FIG. 8 is a schematic plan view of the wafer and substrate support illustrating a scan of the wafer underway.

FIG. 8 shows an initial part of a scanning process of the method. In this process, the wafer W is moved by the substrate support 110 (i.e., by the X-Y stage 100 of the apparatus shown in FIG. 1) at a constant velocity in the −Y direction, as shown by the single-headed arrow to the left of the wafer in the figure. At the same time, the beams 215 (refer to FIG. 3) are deflected by deflectors of the assembly 214 of the beam columns 210 back and forth by uniform amounts in the +X and −X directions, i.e., orthogonally with respect to the direction of wafer movement as shown by the double-headed arrow to the left of the wafer W in the figure. Thus, each time a beam 215 is deflected a full distance (7.68 μm in this example) in either the +X or −X direction as the wafer W is moving in the −Y direction, a single line of the die is scanned by the beam 215. The stage velocity is chosen such that the substrate has moved by one pixel in the −Y direction in the time required to scan 1 line with the beam (raster scan). For this example the pixel size is 15 nm and the beam scan is 512 pixels which is 7.68 um wide. This process is repeated to generate a strip of imaged area. The scanned areas are designated by SA in FIG. 8

Figure 9:
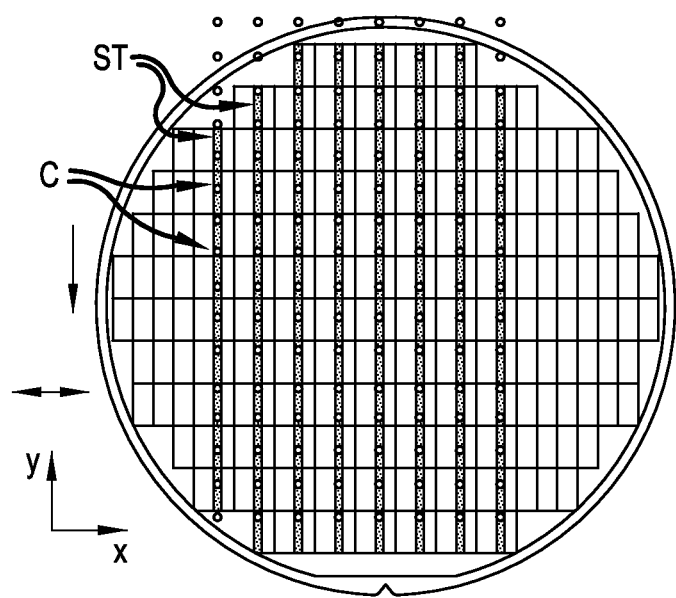
FIG. 9 is a schematic plan view of the wafer and substrate support illustrating the end of the scanning of the wafer.

FIG. 9 shows the completion of the scanning process. At this time, the substrate support 110 and hence, the wafer W, has completed its travel in the −Y direction relative to the imaging system (17 mm in this example corresponding to the center-to-center distance between the beam columns 210 on each rail). As a result, the wafer W is scanned along a plurality of continuous strips ST (eight in this example) covering identical areas on a plurality of dies (91 dies in this example). If, however, the area of interest is wider than the widths (7.68 μm) of the strips, the X-Y stage will index the substrate support 110 in the X direction by an amount slightly less than the strip width (e.g., 10% less) and start a new series of swaths by moving the substrate support 110 at a constant velocity in the +Y direction while the beams 215 are again deflected back and forth (7.68 μm) in the +X and −X directions. The overlap is needed to make sure there are no gaps. This process is repeated until the entirety of the areas of interest are scanned.

The images of the strips are images from identical regions of the dies that can be immediately utilized for die-to-die comparison for defect detection. A method of defect detection which may use images obtained in this way will next be described in detail.

First, however, a conventional method will be described with reference to FIG. 9.

The method starts by obtaining images of three regions on a substrate assumed to be identical (S1). Next, two of the images are aligned, which may require sub-pixel interpolation, and subtracted on a pixel by pixel basis to form a "difference image". The "difference image" is the absolute value of the difference between the two images (S2). A threshold is then applied to the difference image (S3) and pixel values less than the threshold are set to 0. If any pixel value is greater than 0 (S4), then a potential defect is determined to exist, and the third image is then compared with the original two (S5-S7) to determine which of the original two images contains the potential defect.

Thus, for a defect to be detected its signal must not only be higher than the noise in the difference image (S2), it must be higher than the noise in multiple difference images (S2 and S5). A threshold set too low will flag noise and lead to "false defects". These must be kept to extremely small numbers in order for the system to be useful since real defects are assumed to be rare events. In practice, "false defects" need to be limited to a few per $cm^2$.

There are multiple sources of noise, but the three most important for e-beam inspection are:
1. Shot noise due to the limited number of electrons/pixel,
2. Electronic noise in the electron detection and amplification system, and
3. Noise in the electronic lens or deflector that perturbs the scanning electron beam.

Beam current in a SEM is limited by source brightness, lens aberrations and statistical Coulomb repulsion effects. The result is shot noise in images due to the limited number of electrons/pixel. It can be shown for e-beam wafer inspection that this leads to a relationship between pixel rate, defect contrast and false defect rate that is usually the main throughput limiter.

Shot noise from the limited number of electrons per pixel leads to a fundamental limitation on the speed at which low contrast defects can be detected. In the conventional method shown in and described above with reference to FIG. 9, the shot noise in the difference image (S2) determines the detectability of low contrast defects.

The shot noise of a particular pixel in the original image has a variance of $\sqrt{\bar{n}_p}$ where $\bar{n}_p$ is the average detected number of electrons for that pixel. The variance in the difference image for the same pixel is $\sqrt{2\bar{n}_p}$.

The ability to capture the images of large numbers of identical region images, as facilitated by apparatus according to the inventive concept, can greatly improve the results that can be obtained using the conventional method of FIG. 9.

In particular, a method of inspecting a substrate according to the inventive concept is predicated on the realization that if m aligned images of regions intended to be identical are captured and the first (m−1) of the images are averaged by adding the pixel values from each of the images at the same pixel location and dividing by (m−1), the shot noise at a particular pixel of the average image will have a variance of $$\sqrt{\frac{\bar{n}_p}{(m-1)}}.$$

If we now form a difference image from the $m^{th}$ image and the average of the (m−1) images, the variance for a particular pixel will be:

$$\sqrt{\frac{m\bar{n}_p}{(m-1)}}$$

Figure 11:
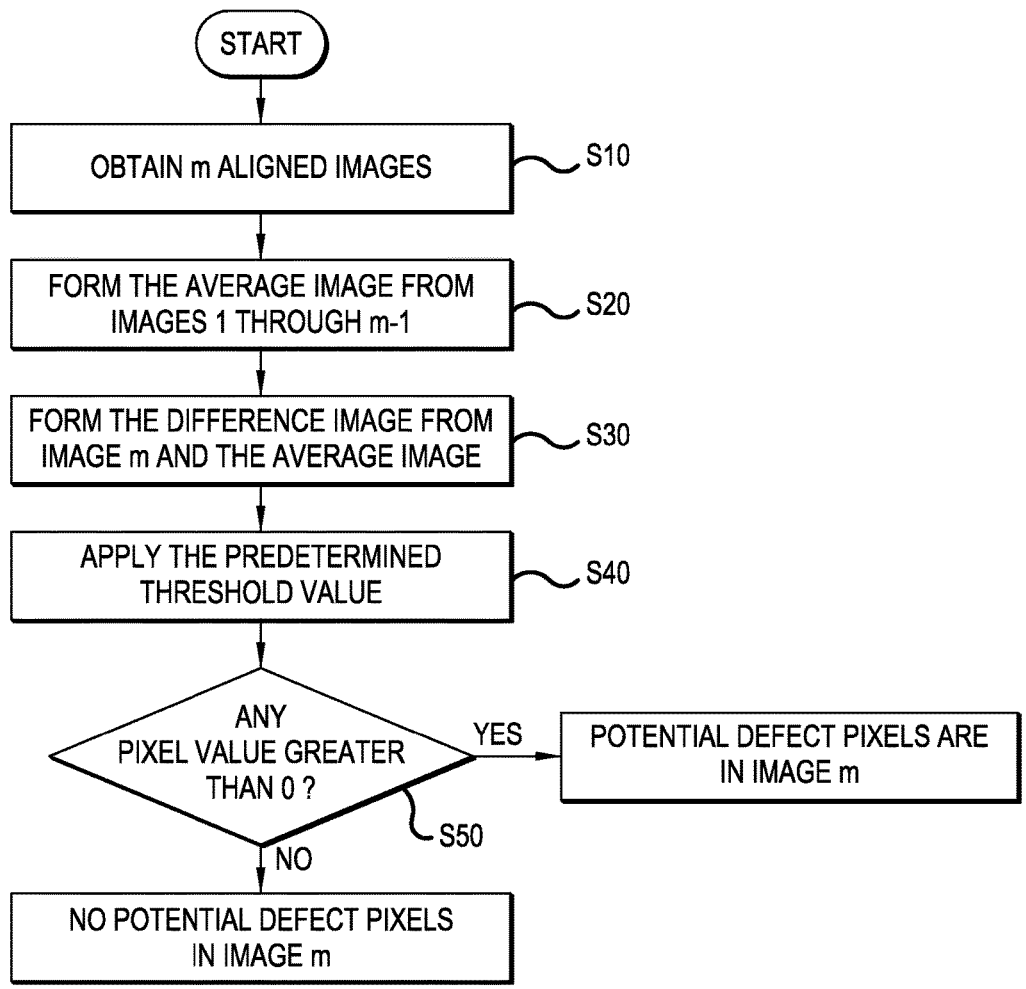
FIG. 11 is a flow chart of a method of inspecting a substrate for defects according to the inventive concept.

Accordingly, referring to FIG. 11, in a method of inspecting a substrate for defects according to the inventive concept, (m) regions of the substrate are captured, wherein m is an integer equal to at least 3, and preferably at least equal to 9. That is, the respective images of at least three of the regions of the substrate, whose patterns are intended to be identical, are captured (S10). The images may be captured by an embodiment of imaging apparatus as shown in and described with reference to FIGS. 1 and 2 or FIG. 4. Also, the images may be captured using the method shown in and described with reference to FIGS. 5-9. Alternatively, the images may be captured by a conventional imaging system. Still further, the processor 300 (FIG. 3) may have a memory in which respective data representing the captured images can be stored.

Then, (m−1) of the captured images are averaged to create an average image of all but one of the captured images (S20). The processor 300 can be configured to carry out the operation of averaging the (m−1) captured images and data representing the average image can be stored in the memory of the processor.

Next, the average image is subtracted from the one image (which was not used to produce the average image) to in turn produce a difference image (S30). This step as well may be carried out by the processor 300. That is, the processor 300 can be configured to carry out the operation of subtracting the images stored in the memory, and storing back in the memory data representing the difference image.

Finally, pixels of the difference image are analyzed to detect a defect in the captured images. First, a threshold is applied to the difference image (S40) and pixel values less than the threshold are set to 0. If any pixel value is greater than 0 (S50), then potential defects are determined to exist in image m.

This method can be carried out for each of the m images, i.e., repeated for each image beginning at S20 by averaging all of the captured images except that image (S20).

As was mentioned above, to be useful the number of false defects due to shot noise needs to be kept below a few per $cm^2$. As an example, assume the pixel size is 15 nm. Since a square cm contains $4.4 \times 10^{11}$ pixels, this implies that, per pixel, the false defect is a $7\sigma$ probability event. Using the same conventions and definitions as W. D. Meisburger, et al., in J. Vac. Sci. Technol. B 9(6), 3010 (1991):

$$P(\gamma) = P\left(C \geq \frac{\gamma\sigma}{n}\right) = P\left(C \geq \gamma\sqrt{\frac{m}{n(m-1)}}\right),$$

where $n=\bar{n}_p$. For $\gamma=7, P(\gamma)=2.6 \times 10^{-12}$.

It is important to note that the definition of the contrast C caused by noise in the difference image is such that it can exceed 100%:

$$C = \left|\frac{x_1 - x_2}{n}\right|.$$

Figure 10:
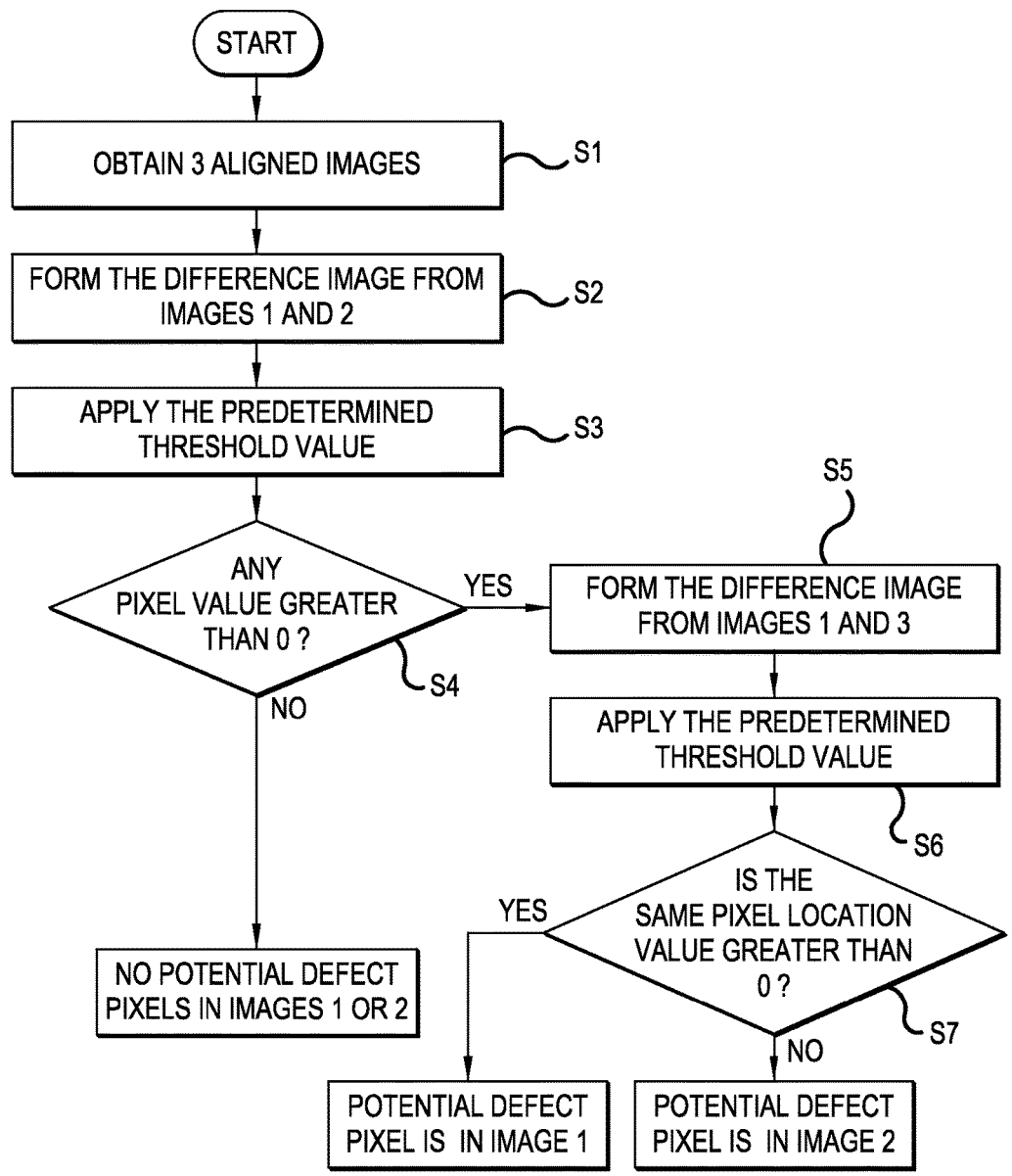
FIG. 10 is a flow chart of a conventional method of detecting defects on a substrate.

These equations lead to a relationship between the shot noise-caused contrast, the number of compared images, and the average number of electrons/pixel. For a conventional case (FIG. 10) in which two images are compared, the relationship is:

TABLE 2

| Contrast % | Electrons # |
|---|---|
| 10 | 9,800 |
| 20 | 2,450 |
| 30 | 1,089 |
| 40 | 613 |
| 50 | 392 |
| 60 | 272 |
| 70 | 200 |
| 80 | 153 |
| 90 | 121 |
| 100 | 98 |

For example, if 392 electrons are detected on average for a particular pixel, then the probability that shot noise will create a contrast of 50% or greater in the difference image will be $2.5 \times 10^{-12}$.

For the case of 20 images using the method (FIG. 11) according to the inventive concept (i.e., m=20), this leads to:

TABLE 3

| Contrast % | Electrons # |
|---|---|
| 10 | 5,158 |
| 20 | 1,289 |
| 30 | 573 |
| 40 | 322 |
| 50 | 206 |
| 60 | 143 |
| 70 | 105 |
| 80 | 81 |
| 90 | 64 |
| 100 | 52 |

The assumption made in the method according to the inventive concept (FIG. 11) is that the average image is a defect free representation of the intended image. If the number of averaged images is large and the probability of defects is small, then this is a reasonable assumption. However, if this is not satisfied, then there is a chance that the the potential defect would be attributed to image m, rather than the average image. In that case, further steps would be needed to match the potential defect to the correct image. For example, if one of the m images contained a potential defect that had a very large pixel value, as compared to normal, and it was not reduced below the threshold value by averaging, then the result would be that all of the m comparisons would show a potential defect at the same pixel location. In that case, one of the m comparisons would have a much higher pixel value in the difference image than the others and would correspond to the image containing the actual potential defect.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. Apparatus for inspecting a substrate, the apparatus comprising:
    an X-Y stage that supports a substrate to be inspected and is operable to move a substrate supported thereby in X and Y directions;
    an imaging system including more than two beam columns operable to irradiate regions of a substrate supported by the X-Y stage with beams of energy, respectively, discrete from one another, wherein respective ones of the beam columns are movable relative to others of the beam columns; and
    a plurality of supports independently movable relative to each other in the X and Y directions, and at least one of the beam columns is mounted to each of the supports so as to be movable therewith, wherein the supports are a plurality of rails, respectively, the rails are supported so as to be movable independently of one another in the X and Y directions, and a plurality of the beam columns are mounted to each of the rails so as to move therewith.

2. Apparatus as claimed in claim 1, wherein each of the beam columns includes a source of electrons, and a deflector operative to deflect a beam of the electrons in a scanning direction.

3. Apparatus as claimed in claim 1, wherein each of the beam columns includes a source of electrons, and a deflector operative to deflect a beam of the electrons in a scanning direction parallel to said one of the directions.

4. Apparatus as claimed in claim 1, wherein the supports include stages each supported so as to be movable independently of one another in the X and Y directions, and at least one of the beam columns is mounted to each of the stages so as to move therewith.

5. Apparatus as claimed in claim 4, wherein only one of the beam columns is mounted to each of the stages.

6. Apparatus as claimed in claim 4, wherein each of the beam columns includes a source of electrons, and a deflector operative to deflect a beam of the electrons in a scanning direction parallel to one of the X and Y directions.

7. Apparatus as claimed in claim 1, wherein the imaging system further comprises:
    detectors that detect emissions from the regions of a substrate irradiated with the beams and produces from the detected emissions data representative of images of the regions of the substrate; and
    a processor operatively connected to each of the detectors so as to receive from the detectors the data representative of images of the regions of the substrate,
    wherein the processor has a memory configured to store the data representative of images of (n+1) of the regions of the substrate, wherein n is an integer equal to at least 2, whereby data representative of the captured images of at least three of the regions of the substrate are stored, and
    the processor is configured to average (m−1) of the captured images to create an average image of all but one of the captured images,
    subtract the average image from the said one of the captured images to produce data representative of a difference image, and
    analyze pixels of the difference image.

* * * * *